US005831497A

United States Patent [19]

Yorita et al.

[11] Patent Number: 5,831,497

[45] **Date of Patent: *Nov. 3, 1998**

[54] DIELECTIRC RESONATOR APPARATUS

[75] Inventors: Tadahiro Yorita; Hirohumi Miyamoto, both of Ishikawa, Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 767,516

[22] Filed: Dec. 16, 1996

Related U.S. Application Data

[63] Continuation of Ser. No. 301,451, Sep. 6, 1994, abandoned.

[30] Foreign Application Priority Data

Sep. 6, 1993 [JP] Japan .................................... 5-221068

[51] Int. Cl.[6] ...................................................... H10P 1/202

[52] U.S. Cl. ............................................ 333/202; 333/206

[58] Field of Search .................................... 333/202, 206, 333/207

[56] References Cited

U.S. PATENT DOCUMENTS

| | | | |
|---|---|---|---|
| 5,402,090 | 3/1995 | Shimizu | 333/206 |
| 5,572,175 | 11/1996 | Tada et al. | 333/206 |

FOREIGN PATENT DOCUMENTS

| | | | |
|---|---|---|---|
| 53201 | 3/1983 | Japan | 333/202 DB |
| 90201 | 4/1988 | Japan | 333/202 DB |
| 283201 | 11/1988 | Japan | 333/202 DB |
| 4095401 | 3/1992 | Japan | 333/202 DB |
| 4103203 | 4/1992 | Japan | 333/202 DB |
| 5145302 | 6/1993 | Japan | 333/206 |
| 2270424 | 3/1994 | United Kingdom | 333/206 |

*Primary Examiner*—Seungsook Ham
*Attorney, Agent, or Firm*—Majestic, Parsons, Siebert & Hsue P.C.

[57] ABSTRACT

A dielectric resonator apparatus is formed with a dielectric block having an outer electrode on its outer surfaces and a plurality of throughholes formed therethrough and having inner electrodes therein so as to serve as resonators. Electrodes for capacitively coupling these resonators and input/output electrode for providing external connection capacitance are also formed on the dielectric block separate from the outer electrode at different distances from the throughholes according to desired levels of capacitive coupling and external connection capacitance.

14 Claims, 3 Drawing Sheets

DIELECTIRC RESONATOR APPARATUS

This is a continuation of application Ser. No. 08/301,451 filed Sep. 6, 1994, now abandoned.

BACKGROUND OF THE INVENTION

This invention relates to dielectric resonator apparatus having capacitively coupling electrodes and input/output electrodes.

Dielectric resonator apparatus having resonator electrodes formed inside a dielectric block and grounding electrodes and input/output electrodes formed outside the same dielectric block are commonly used as bandpass filters as well as band stop filters. FIGS. 5 and 6 show a prior art dielectric resonator apparatus 30 of this kind comprising a dielectric block 40 and a substrate 2 to be attached to the block 40. The dielectric block 40 has five resonator-forming throughholes 3*a*–3*e* formed therethrough, connecting its first end surface 1*a* and second end surface 1*b* and arranged so as to be mutually coplanar and mutually separated by equal intervals. An inner conductor 4 is formed inside each of these throughholes 3*a*, 3*b*, 3*c*, 3*d*, 3*e* and an outer conductor 5 is formed on the outer surfaces of the dielectric block 40. The inner conductors 4 have open ends at the first end surface 1*a* of the block 40. These open ends are formed by removing portions of the inner conductors 4 at the first end surface 1*a*. The inner conductors 4 are electrically connected, however, to the outer conductor 5 on the second end surface 1*b* of the block 40. On the bottom surface of the dielectric block 40, as shown in FIG. 6, input/output electrodes 6 and so-called capacitively coupling electrodes 7 are formed by removing portions of the outer conductor 5. The capacitively coupling electrodes 7 are so referred to because they are adapted to capacitively couple the resonators formed inside the throughholes 3*a*–3*e*. In a dielectric resonator apparatus thus constructed, the electrodes for obtaining coupling capacitance must be small because the coupling capacitance is smaller than input/output capacitance. As a result, it has been difficult to design a reliable resonator apparatus of this kind.

The substrate 2 is made of a material having a low dielectric constant selected from ceramics such as alumina or glass or resins. A grounding electrode 8, input/output electrodes 9 and a bypass electrode 10 are formed on the substrate 2. As the substrate 2 thus prepared is affixed to the bottom surface 1*d* of the dielectric block 40, the input/output electrodes 6 formed on the dielectric block 40 and the input/output electrodes 9 formed on the substrate 2 are joined together, the capacitively coupling electrodes 7 formed on the dielectric block 40 are connected with the bypass electrode 10 formed on the substrate 2, and the outer conductor 5 on the dielectric block 40 becomes connected to the grounding electrode 8 on the substrate 2. Resist films 11 are formed on the upper surface of the substrate 2 (as shown by broken lines in FIG. 6), serving to insulate the input/output electrodes 9 and the bypass electrode 10 from the outer conductor 5. The dielectric resonator apparatus 30 thus structured is adapted to be surface-mounted onto a circuit board (not shown) through the substrate 2.

SUMMARY OF THE INVENTION

If it is desired to obtain capacitance of a specified level in a prior art dielectric resonator apparatus of the kind described above, its capacitively coupling electrodes must be made much smaller than its input/output electrodes because of the difference in required capacitance. As a result, there has always been a problem with the designing of the capacitively coupling electrodes.

It is therefore an object of this invention to provide a dielectric resonator apparatus with capacitively coupling electrodes and input/output electrodes of about the same size, of which the coupling capacity can be adjusted by changing the positions of its resonator-forming throughholes.

A dielectric resonator apparatus according to the present invention, with which the above and other objects can be accomplished, may be characterized not only as having a plurality of resonator-forming throughholes in a dielectric block, an outer conductor on the outer surfaces of the dielectric block and input/output electrodes formed by removing portions of the outer conductor, but also wherein the distances of electrodes for obtaining polarized capacitance and electrodes for obtaining external coupling capacitance from the throughholes are determined according to the capacitance of each electrode.

With a dielectric resonator apparatus thus formed, the capacitively coupling electrodes for obtaining polarized capacitance can be made as large as the input/output electrodes for obtaining external coupling capacitance. Thus, the process of their formation becomes easier and more reliable. Since the throughholes are formed in a zigzag arrangement, furthermore, the longitudinal dimension of the apparatus as a whole can be reduced without affecting the coupling characteristics determined by the separation between mutually adjacent pairs of these throughholes.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

In these figures, components which are equivalent or at least substantially similar to each other are indicated by the same numerals.

DETAILED DESCRIPTION OF THE INVENTION

Figure 1:
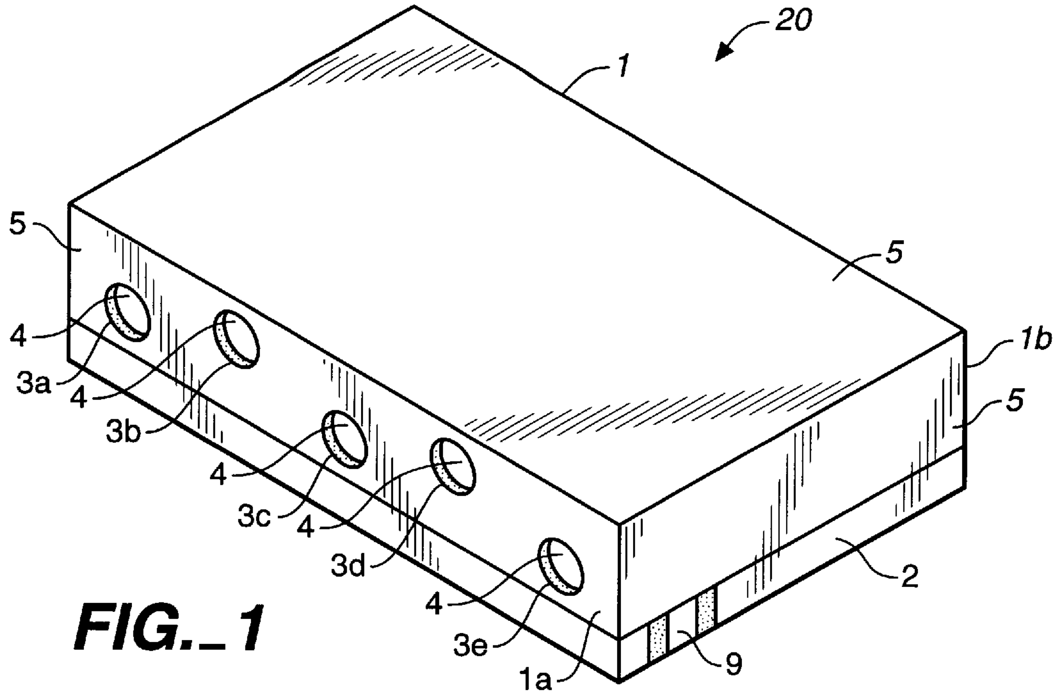
FIG. 1 is a diagonal view of a dielectric resonator apparatus embodying the invention.
Figure 5:
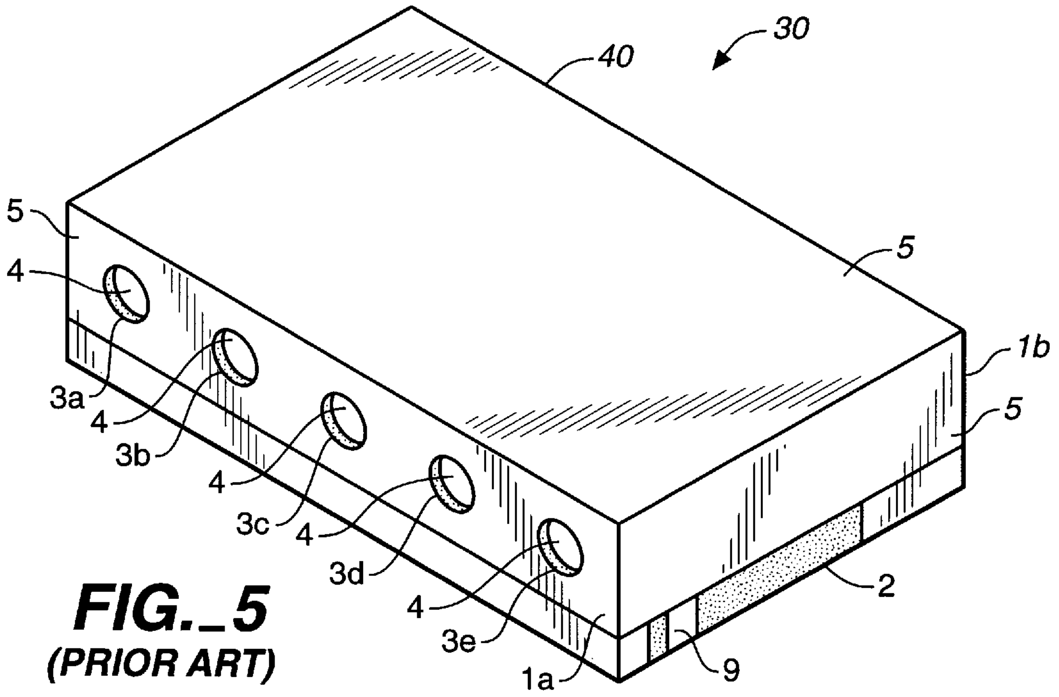
FIG. 5 (PRIOR ART)
FIG. 5 is a diagonal view of a prior art dielectric resonator apparatus.
Figure 2:
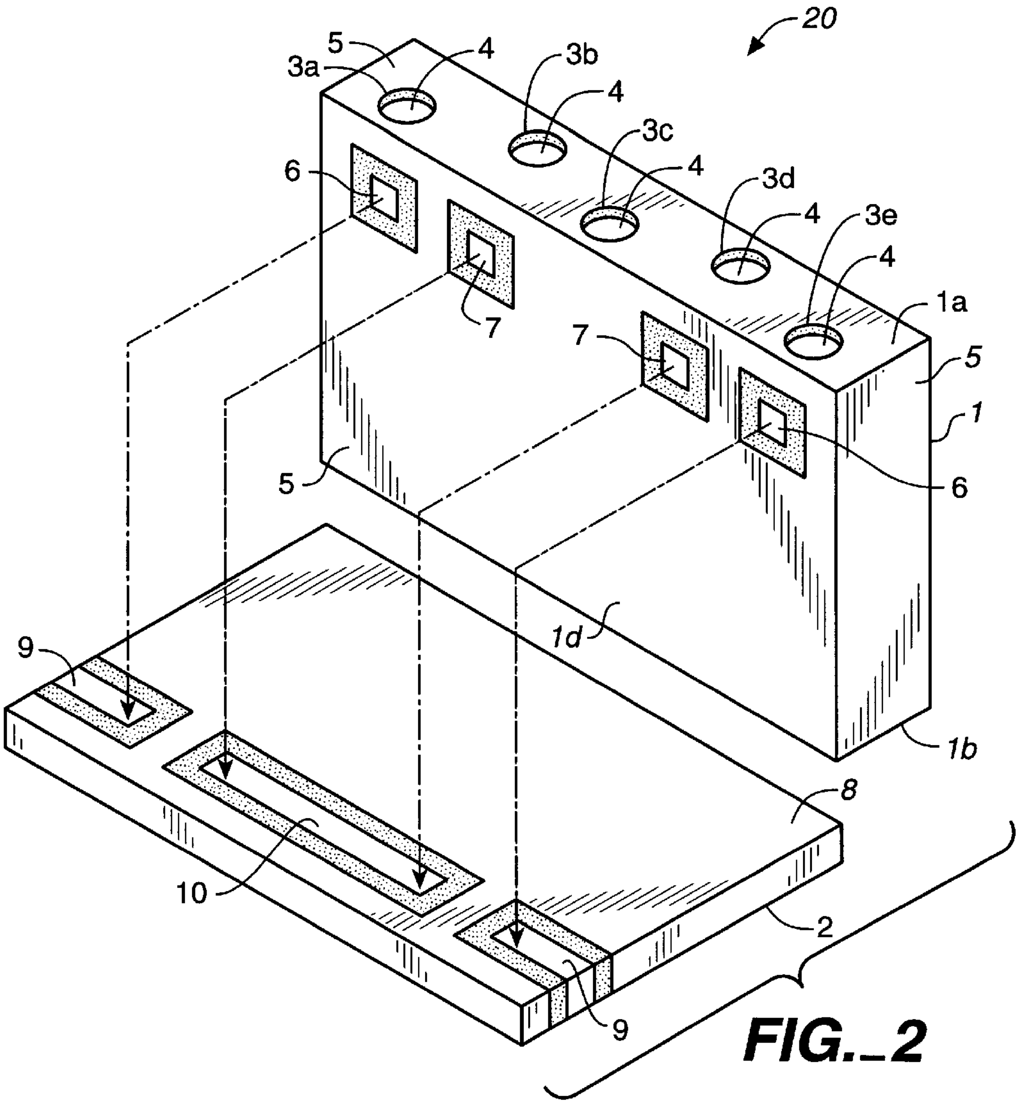
FIG. 2 is a diagonal view of the dielectric resonator apparatus of FIG. 1 before it is assembled.

As shown in FIGS. 1 and 2, a dielectric resonator apparatus 20 embodying the invention comprises a dielectric block 1 and a substrate 2 to be attached to the block 1. The dielectric block 1 is substantially a rectangular parallelopiped with a planar bottom surface 1*d* (see FIG. 2), over which the substrate is attached, and has five resonator-forming throughholes 3*a*, 3*b*, 3*c*, 3*d*, 3*e* formed therethrough, connecting its first end surface 1*a* and second end surface 1*b* extending parallel to one another and also to the bottom surface 1*d* and being arranged next to one another sequentially from one side edge to the opposite side edge of the block 1 along the bottom surface 1*d*. As can be seen more clearly in FIG. 2, input/output electrodes 6 for external connection are formed on the bottom surface 1*d* of the dielectric block 1 near the two side edges and so-called capacitively coupling electrodes 7 are formed also on the bottom surface 1*d* between the two input/output electrodes 6. The throughholes 3*a,* 3*b,* 3*c,* 3*d,* 3*e* are arranged sequentially in this order. The two throughholes at the ends of this sequence (3*a* and 3*e*) are closer to the bottom surface 1*d* and sufficiently near the input-output electrodes 6 so as to couple therewith and those which are the second from either side (3*b* and 3*d*) are opposite to the capacitively coupling electrodes 7 but farther away from the bottom surface 1*d* of the block 1 to capacitively couple therewith. The throughhole at the center (3*c*), which is between the two throughholes 3*b* and 3*d* for capacitively coupling with the capacitively coupling electrodes 7, is closer to the bottom surface 1*d* than the second throughholes 3*b* and 3*d*. Thus, these five throughholes 3*a*–3*e* are sequentially arranged nearly parallel to the bottom surface 1*d* of the block 1 from one side edge to the opposite side edge, but they are not coplanar with respect to one another, forming a zigzag on the side surface of the block 1.

An outer conductor 5 is formed on the outer surfaces of the dielectric block 1, and an inner conductor 4 is formed inside each of the resonator throughholes 3*a*–3*e*. The inner conductors 4 have open ends at the first end surface 1*a* of the block 1. These open ends are formed by removing portions of the inner conductors 4 at the first end surface 1*a*. The inner conductors 4 are electrically connected, however, to the outer conductor 5 on the second end surface 1*b* of the block 1. On the bottom surface 1*d* of the dielectric block 1, as shown in FIG. 2, the input/output electrodes 6 and the capacitively coupling electrodes 7 are formed by removing portions of the outer conductor 5. The capacitively coupling electrodes 7 are adapted to capacitively couple the resonators formed by the throughholes 3*b* and 3*d*. The input/output electrodes 6 and the capacitively coupling electrodes 7 can have about the same area although the capacitance $C_2$ required between the inner conductor 4 and the capacitively coupling electrode 7 is smaller than the capacitance $C_1$ required between the inner conductor 4 and the input/output electrode 6 because their magnitudes are intimately related to the positions of the resonator throughholes 3*a*–3*e.*

Figure 3:
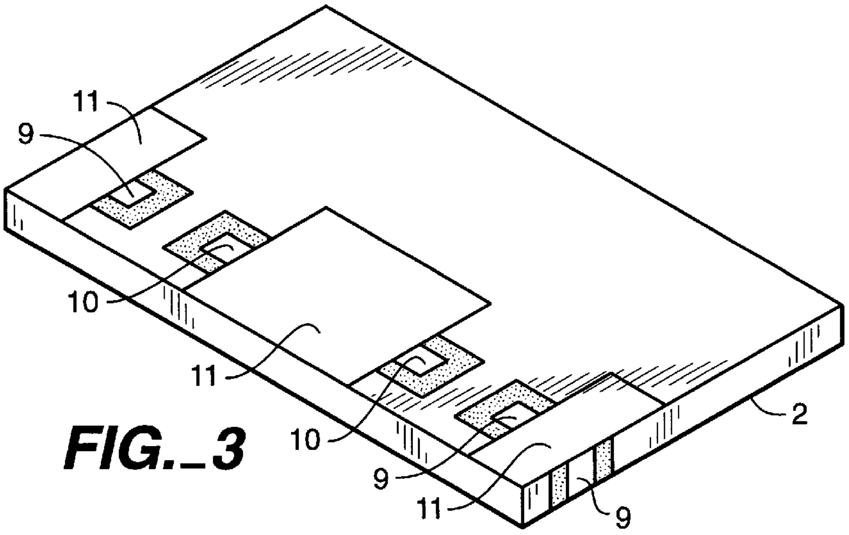
FIG. 3 is a diagonal view of a substrate used in the dielectric resonator apparatus of FIGS. 1 and 2.

The substrate 2 is made of a material having a low dielectric constant selected from ceramics such as alumina or glass or resins such as Vectra (trade name by Celanese Corporation). A grounding electrode 8, input/output electrodes 9 and a bypass electrode 10 are formed on the substrate 2 (see FIG. 2). As the substrate 2 thus prepared is affixed to the bottom surface 1*d* of the dielectric block 1, the input/output electrodes 6 formed on the dielectric block 1 and the input/output electrodes 9 formed on the substrate 2 are joined together, the capacitively coupling electrodes 7 formed on the dielectric block 1 are connected with the bypass electrode 10 formed on the substrate 2, and the outer conductor 5 on the dielectric block 1 becomes connected to the grounding electrode 8 on the substrate 2. Resist films 11, which are shown in FIG. 3 but not in FIG. 2, are formed on the upper surface of the substrate 2, serving to insulate the input/output electrodes 9 and the bypass electrode 10 from the outer conductor 5. This dielectric resonator apparatus is adapted to be surface-mounted onto a circuit board (not shown) through the substrate 2.

Figure 4:
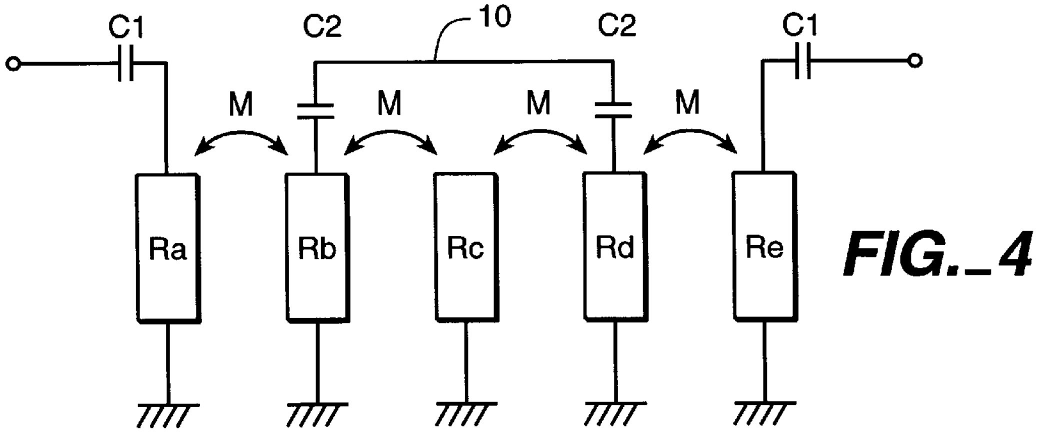
FIG. 4 is an equivalent circuit diagram of the dielectric resonator apparatus of FIG. 1.
Figure 6:
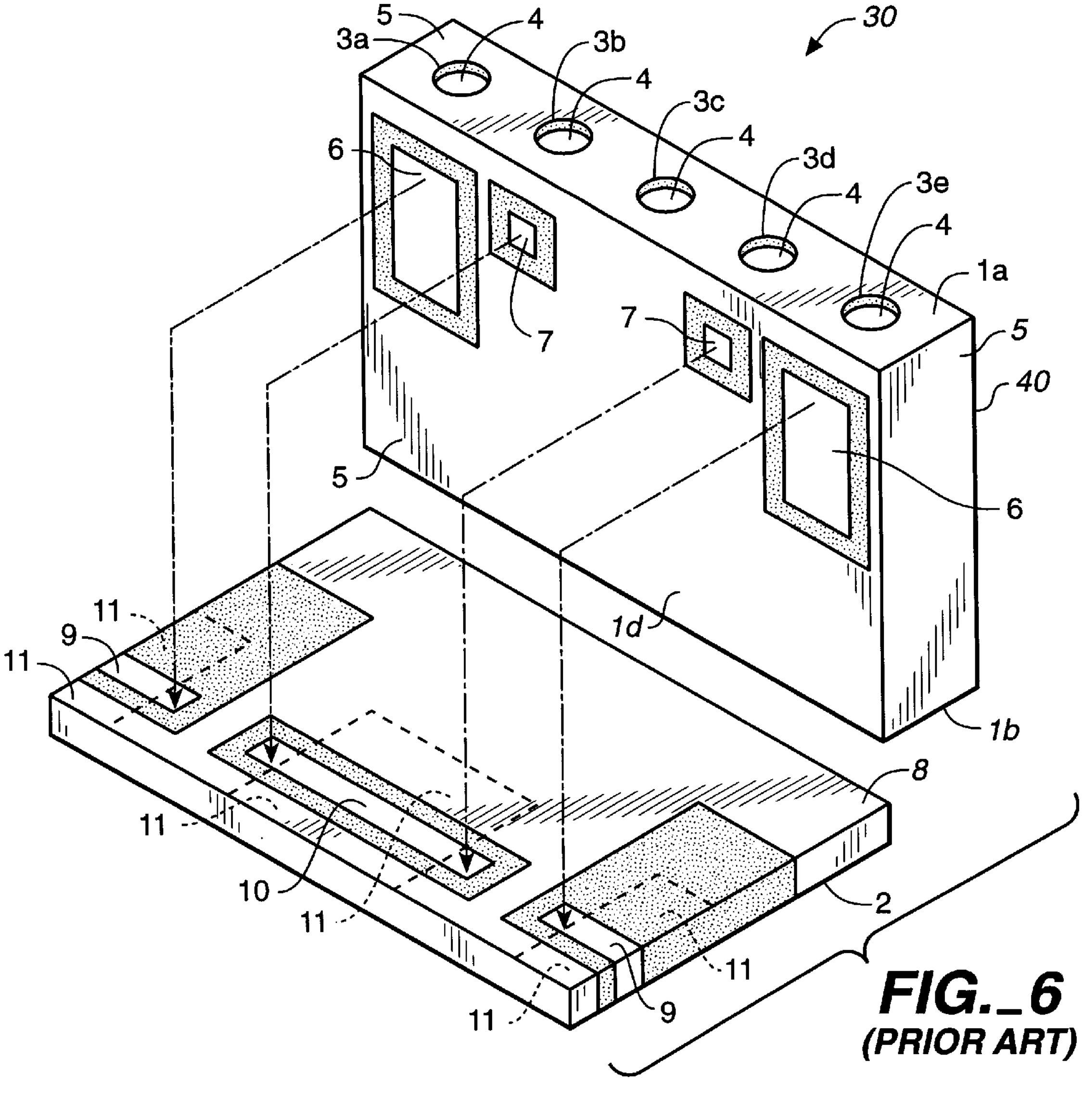
FIG. 6 (PRIOR ART)
FIG. 6 is a diagonal view of the prior art dielectric resonator apparatus of FIG. 5 before it is assembled.

In FIG. 4, which is an equivalent circuit diagram of the dielectric resonator apparatus shown in FIGS. 1 and 2, resonators $R_a$, $R_b$, $R_c$, $R_d$, $R_e$ respectively correspond to those formed inside the throughholes 3*a*, 3*b*, 3*c*, 3*d*, 3*e* and mutually coupled inductively (indicated symbolically by M). The resonators $R_a$ and $R_e$ are coupled to the input/output electrodes 9 through respective input/output capacitance $C_1$, and the resonators $R_b$ and $R_d$ are coupled to the capacitively coupling electrodes 7 through coupling capacitance $C_2$. The two capacitively coupling electrodes 7 are connected to each other, or bypassed, through the bypass electrode 10. A dielectric resonator apparatus, with such electrical structure as shown in FIG. 1, can function as a polarized bandpass filter.

In summary, a dielectric resonator apparatus according to the present invention comprises a dielectric block with a plurality of resonator-forming throughholes and a substrate, and the distance between each of the throughholes from the substrate is varied according to the external connection capacitance and the coupling capacitance between resonators such that the input/output electrodes and the capacitively coupling electrodes can have about the same area. Thus, the design becomes simpler and its reliability improves. Since the coupling coefficient is determined by the distance between throughholes, furthermore, apparatus according to the present invention can be made more compact because the plurality of throughholes are not arranged on a plane but their central axes are arranged in a wavy zigzag formation.

What is claimed is:

1. A dielectric resonator apparatus comprising:

a dielectric block with resonators formed inside a plurality of throughholes through said block;

an outer electrode formed on outer surfaces of said dielectric block;

capacitively coupling electrodes which are formed separate from said outer electrode on said block and serve to capacitively couple said resonators; and input/output electrodes which are formed separate from said outer electrode on said block for providing respective external connection capacitances; said capacitively coupling electrodes and said input/output electrodes being on one of said outer surfaces which is parallel to said throughholes, those of said throughholes associated with said input/output electrodes being at a shorter distance from said input/output electrodes than those of said throughholes associated with said capacitively coupling electrodes are from said capacitively coupling electrodes.

2. The dielectric resonator apparatus of claim 1 wherein said plurality of throughholes are mutually parallel, not all of said plurality of throughholes lying on a single plane.

3. The dielectric resonator apparatus of claim 2 further comprising a substrate having an upper surface, said dielectric block having a bottom surface contacting said upper surface of said substrate, said capacitively coupling electrodes and said input/output electrode being formed between said bottom surface of said block and said upper surface of said substrate.

4. The dielectric resonator apparatus of claim 1 further comprising a substrate having an upper surface, said dielectric block having a bottom surface contacting said upper surface of said substrate, said capacitively coupling electrodes and said input/output electrode being formed between said bottom surface of said block and said upper surface of said substrate, said plurality of throughholes being parallel to said bottom surface, some of said plurality of throughholes being closer to said bottom surface than the others of said plurality of throughholes.

5. A dielectric resonator apparatus comprising:

a dielectric block having outer surfaces including a planar bottom surface, said block having resonators formed inside a plurality of throughholes through said block, said plurality of throughholes being parallel mutually and to said bottom surface;

an outer electrode formed on said outer surfaces of said dielectric block;

input/output electrodes which are formed separate from said outer electrode on said planar bottom surface of said block for providing respective external connection capacitances; and capacitively coupling electrodes serving to capacitively couple said resonators, said capacitively coupling electrodes being formed separate from said outer electrode on said bottom surface of said block between said input/output electrodes; those of said throughholes associated with said input/output electrodes being at a shorter distance from said bottom surface than those of said throughholes associated with said capacitively coupling electrodes are from said bottom surface.

6. The dielectric resonator apparatus of claim 5 wherein said plurality of throughholes are arranged next to one another in a sequence, said input/output electrodes being positioned closest respectively to a first one and a last one of said plurality of throughholes in said sequence.

7. The dielectric resonator apparatus of claim 5 wherein at least one of said plurality of throughholes in said sequence is between two of said plurality of throughholes capacitively coupling with said capacitively coupling electrodes.

8. The dielectric resonator apparatus of claim 7 wherein said at least one of said plurality of throughholes is closer to said bottom surface than said two capacitively coupling throughholes.

9. The dielectric resonator apparatus of claim 5 further comprising a substrate having an upper surface contacting said bottom surface, said capacitively coupling electrodes and said input/output electrode being formed between said bottom surface of said block and said upper surface of said substrate.

10. The dielectric resonator apparatus of claim 9 further comprising a bypass electrode on said upper surface of said substrate, said bypass electrode electrically connecting said capacitively coupling electrodes on said bottom surface of said block.

11. The dielectric resonator apparatus of claim 8 further comprising a substrate having an upper surface contacting said bottom surface, said capacitively coupling electrodes and said input/output electrode being formed between said bottom surface of said block and said upper surface of said substrate.

12. The dielectric resonator apparatus of claim 11 further comprising a bypass electrode on said upper surface of said substrate, said bypass electrode electrically connecting said capacitively coupling electrodes on said bottom surface of said block.

13. The dielectric resonator apparatus of claim 1 wherein said capacitively coupling electrodes and said input/output electrodes have substantially same surface areas.

14. The dielectric resonator apparatus of claim 5 wherein said capacitively coupling electrodes and said input/output electrodes have substantially same surface areas.

* * * * *